US006579785B2

(12) United States Patent
Toyoda et al.

(10) Patent No.: US 6,579,785 B2
(45) Date of Patent: Jun. 17, 2003

(54) METHOD OF MAKING MULTI-LEVEL WIRING IN A SEMICONDUCTOR DEVICE

(75) Inventors: Hiroshi Toyoda, Yokohama (JP); Tetsuo Matsuda, Tano-gun (JP); Hisashi Kaneko, Fujisawa (JP); Hideaki Hirabayashi, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/767,724

(22) Filed: Jan. 24, 2001

(65) Prior Publication Data

US 2001/0013617 A1 Aug. 16, 2001

(30) Foreign Application Priority Data

Jan. 25, 2000 (JP) .................................. 2000-016189
Mar. 28, 2000 (JP) .................................. 2000-089289

(51) Int. Cl.⁷ .............................................. H01L 21/44
(52) U.S. Cl. ........................ 438/597; 438/629; 438/687
(58) Field of Search ................................. 438/597, 629, 438/687, 648

(56) References Cited

U.S. PATENT DOCUMENTS

| 5,470,789 A | 11/1995 | Misawa |
| 5,575,885 A | 11/1996 | Hirabayashi et al. |
| 5,731,634 A | 3/1998 | Matsuo et al. |
| 5,770,095 A | * 6/1998 | Sasaki et al. ............... 216/38 |
| 5,854,140 A | * 12/1998 | Jaso et al. ................. 438/740 |
| 5,877,076 A | * 3/1999 | Dai ............................. 438/597 |
| 6,114,243 A | * 9/2000 | Gupta et al. ................ 438/687 |

FOREIGN PATENT DOCUMENTS

JP          6-275612         9/1994

OTHER PUBLICATIONS

Copy of U.S. Patent Application Serial No. 09/677,743 filed Oct. 3, 2000 (applicants: Toyoda et al.).

* cited by examiner

Primary Examiner—Kamand Cuneo
Assistant Examiner—Scott B. Geyer
(74) Attorney, Agent, or Firm—Finnegan, Henderson, Farabow, Garrett & Dunner, L.L.P.

(57) ABSTRACT

A method of manufacturing a semiconductor device, which comprises the steps of forming an intermediate layer on an insulating layer, forming a groove in the intermediate layer and the insulating layer, forming a first barrier layer on the intermediate layer, depositing a wiring layer on the first barrier layer to thereby fill the groove with the wiring layer, performing a flattening treatment of the wiring layer, removing a surface portion of the wiring to thereby permit the surface of the wiring to be recessed lower than a surface of the insulating layer, thus forming a recessed portion, forming a second barrier layer on the intermediate layer and on an inner wall of the recessed portion, performing a flattening treatment of the second barrier layer, thereby, and selectively removing the intermediate layer, exposing the insulating layer.

16 Claims, 11 Drawing Sheets

METHOD OF MAKING MULTI-LEVEL WIRING IN A SEMICONDUCTOR DEVICE

CROSS-REFERENCE TO RELATED APPLICATIONS

This application is based upon and claims the benefit of priority from the prior Japanese Patent Applications No. 2000-016189, filed Jan. 25, 2000; and No. 2000-089289, filed Mar. 28, 2000, the entire contents of which are incorporated herein by reference.

BACKGROUND OF THE INVENTION

This invention relates to the technology for multi-layer wiring, and in particular, to a semiconductor device having a wiring which is entirely covered by a barrier layer, and to a method of manufacturing such a semiconductor device.

Since Cu in a Cu-wiring would act as a life time killer, it is indispensable for the purpose of inhibiting Cu from diffusing into an interlayer insulating film to provide a barrier layer on the surface of the Cu-wiring which is contact with the interlayer insulating film. Additionally, it is also required to form another barrier layer on the upper surface of the Cu-wiring for the purpose of preventing the upper surface of the Cu-wiring from being oxidized during the manufacturing process of semiconductor device.

As for the upper barrier layer to be formed on the upper surface of the Cu-wiring, silicon nitride film has been conventionally employed. The employment of this silicon nitride film, however, is accompanied with a problem that the capacitance between intralevel wirings is caused to increase due to the fact that the dielectric constant of silicon nitride is relatively high.

With a view to overcome the aforementioned problem, there has been proposed a method wherein a barrier layer which is the same as or equivalent to that employed for the sidewalls and bottom surfaces of the Cu-wiring is employed for covering the upper surface of the Cu-wiring, thereby completely enclosing the Cu-wiring with the barrier layer. A method has been proposed to obtain this structure wherein a Cu-damascene wiring is formed at first, and then, so-called recess etching is performed so as to enable the upper surface of the Cu-wiring to be recessed from the surface of the surrounding interlayer insulating film, after which a barrier layer is deposited all over the wafer and then, the barrier layer is removed by means of the CMP (Chemical Mechanical Polishing) method except the portions thereof which are deposited on the Cu-wiring.

It is desirable in this case to minimize the depth of the recess in order to minimize the capacitance between intralevel wirings. However, if the depth of the recess is minimized, it may become difficult to leave a barrier layer having a sufficient thickness in the recess throughout the entire pattern thereof on the wafer due to the non-uniformity of the polishing velocity in-plane of the CMP (Chemical Mechanical Polishing) or due to the phenomenon of dishing.

Even though the capacitance between intralevel wirings may be increased somewhat, it is possible, by increasing the depth of the recess, to overcome the aforementioned problem accompanied with the CMP. However, since the magnitude of step between the surface of barrier layer and the surface of the insulating film after the formation of the barrier layer becomes too large, it invites another problem that it becomes difficult to ensure a sufficient coverage of films to be deposited thereon in the following steps such as the deposition of an oxide film.

A popular method is to employ a PVD or a CVD method for forming a barrier layer after so-called "recess etching step". However, it is necessary, for that purpose, to deposit the barrier layer on the bottom of the recessed portion, which is constituted by the surface of wiring. Therefore, if the step coverage characteristic to be obtained by the PVD or CVD is insufficient, it would become impossible to enable the barrier layer to sufficiently exhibit its function.

Further, the process of forming a barrier layer on the upper surface of wiring is generally consisted of the steps of; performing the CMP for forming a wiring, performing the recess etching of the upper portion of wiring; cleaning the resultant surface (if required); forming a barrier layer; removing a redundant portion of the barrier layer by means of the CMP; and performing the CMP again (if required).

In this process, all of the steps excluding the step of forming a barrier layer are generally performed by a wet treatment. Therefore, if the step of forming a barrier layer can be performed by a wet treatment, it may become possible that a sequence of the entire steps can be continuously performed inside a wet system device. Meantime, a wet plating method is known to be useful in realizing an excellent step coverage characteristic, and therefore, the employment of this wet plating method would be convenient since it makes it possible to secure a continuous processing of all of the aforementioned steps in a wet system.

Under the circumstances, an electroless plating method is now tried as a wet type method for forming a barrier layer. Since it is possible, according to this electroless plating method, to selectively form a metal film in conformity with partitioned wiring, it seems to be apparently a promising method. As a matter of fact however, the method is actually accompanied with much restrictions. Namely, due to the specific principle of the electroless plating method, the kinds of metal that can be formed into a film on the surface of the metal wiring is extremely limited. Actually, in the case where a barrier layer is to be formed on the upper surface of a copper wiring that has been formed by means of the damascene method, there is no metal film that can be suitably formed on the copper wiring.

On the other hand, since the electro-plating method is designed to be performed in such a way that metal ions are electro-deposited on the surface of electroconductive film, the electro-plating method can be hardly influenced by the kinds of plating material. However, it is required in the case of electro-plating method to apply a sufficient electric potential to the wiring for performing the plating. However, since the wiring is partitioned into a plurality of sections at the moment of depositing a metal film on the surface of the wiring according to the ordinary manufacturing step, it is impossible to transmit a plating current to the entire sections of wiring.

Additionally, the following problems have been found when an acid is employed in the step of recess etching of Cu-wiring. Namely, the etching is accelerated especially at the interface between the barrier layer and the Cu-wiring, so that the magnitude of recess becomes more prominent at the sidewall portion of the Cu-wiring than at the central portion of the Cu-wiring. Further, the magnitude of recess is dependent not only on the particular region within the wafer but also on the configuration of the pattern of Cu-wiring. As a result, it has been impossible to sufficiently secure the coverage (covering characteristic) of the barrier layer at the sidewall portion of Cu-wiring in a subsequent step of forming a barrier layer, thereby raising various problems that the Cu-wiring may be oxidized during the subsequent steps, and that the diffusion of Cu is caused to occur, thus deteriorating the yield. There is also a problem that it is difficult to obtain a desired characteristic of semiconductor device due to a difference in resistance of wiring among the surface regions of wafer or among the patterns of wiring.

BRIEF SUMMARY OF THE INVENTION

Therefore, an object of this invention is to provide a method of manufacturing a semiconductor device, which is capable of minimizing the magnitude of step between the upper surface of wiring and the upper surface of insulating layer even if the magnitude of recess is increased for securing a sufficient residual film thickness of a barrier layer covering the upper surface of the wiring, thereby making it possible to overcome various problems such as an insufficient coverage of an insulating film to be formed in a subsequent step due to a large step between the upper surface of wiring and the upper surface of insulating layer, and also making it possible to inhibit the capacitance between intralevel wirings excessively increasing.

Another object of this invention is to provide a method of manufacturing a semiconductor device, which is capable of forming a barrier layer by means of an electro-plating method for covering the upper surface of a wiring.

A further object of this invention is to provide a method of manufacturing a semiconductor device, which is capable of improving the yield through a uniform recess etching of the upper surface of a wiring.

A further object of this invention is to provide a semiconductor device which can be manufactured by the aforementioned methods.

A further object of this invention is to provide an etching solution to be employed in the methods of this invention.

According to the present invention, there is provided a method of manufacturing a semiconductor device, which comprises the steps of:

forming an intermediate layer on an insulating layer formed in advance on a semiconductor substrate;

forming a groove in the intermediate layer and the insulating layer;

forming a first barrier layer on a surface of the intermediate layer as well as on an inner surface of the groove;

depositing a wiring layer on a surface of the first barrier layer to thereby fill the groove with the wiring layer;

performing a flattening treatment of a surface of the wiring layer to thereby form a buried structure consisting of the first barrier layer and a wiring inside the groove;

removing a surface portion of the wiring to thereby permit the surface of the wiring to be recessed to a level which is lower than a surface of the insulating layer, thus forming a recessed portion;

forming a second barrier layer on a surface of the intermediate layer as well as on an inner surface of the recessed portion;

performing a flattening treatment of a surface of the second barrier layer, thereby allowing the surface of the intermediate layer to be exposed; and selectively removing the intermediate layer, thereby allowing the surface of the insulating layer to be exposed.

Further, according to the present invention, there is also provided a method of manufacturing a semiconductor device, which comprises the steps of:

forming a groove in an insulating layer formed in advance on a semiconductor substrate;

forming a first barrier layer on a surface of the insulating layer as well as on an inner surface of the groove;

depositing a wiring layer on a surface of the first barrier layer to thereby fill the groove with the wiring layer;

performing a flattening treatment of a surface of the wiring layer to thereby allow the first barrier layer to be continuously left at least on the insulating layer throughout an entire surface of the semiconductor substrate, thereby filling the groove with a wiring;

removing a surface portion of the wiring to thereby permit the surface of the wiring to be recessed to a level which is lower than a surface of the insulating layer, thus forming a recessed portion;

forming a second barrier layer on the first barrier layer as well as on the wiring by means of an electro-plating method where the first barrier layer remaining on the insulating layer is employed as an electrode; and performing a flattening treatment of surfaces of the second barrier layer and the first barrier layer until the surface of the insulating layer is exposed.

Further, according to the present invention, there is also provided a method of manufacturing a semiconductor device, which comprises the steps of:

forming a conductive layer on an insulating layer formed in advance on a semiconductor substrate;

forming a groove in the conductive layer and the insulating layer;

forming a first barrier layer on a surface of the conductive layer as well as on an inner surface of the groove;

depositing a wiring layer on a surface of the first barrier layer to thereby fill the groove with the wiring layer;

performing a flattening treatment of a surface of the wiring layer to thereby allow the conductive layer to be continuously left at least on the insulating layer, thereby filling the groove with a wiring;

removing a surface portion of the wiring to thereby permit the surface of the wiring to be recessed to a level which is lower than a surface of the insulating layer, thus forming a recessed portion;

forming a second barrier layer on the conductive layer as well as on the wiring by means of an electro-plating method where the conductive layer remaining on the insulating layer is employed as an electrode; and performing a flattening treatment of surfaces of the second barrier layer and the conductive layer until the surface of the insulating layer is exposed.

Further, according to the present invention, there is also provided a method of manufacturing a semiconductor device, which comprises the steps of:

forming a groove in an insulating layer formed in advance on a semiconductor substrate;

forming a first barrier layer on a surface of insulating layer;

depositing a wiring layer on a surface of the first barrier layer to thereby fill the groove with the wiring layer;

performing a flattening treatment of a surface of the wiring layer to thereby forming a structure consisting of the first barrier layer and a wiring which are buried inside the groove;

performing a recess etching treatment of the wiring by making use of an etching solution comprising an oxidizing agent which is reactive to main element constituting the wiring, a complex forming agent which is capable of forming a complex together with ions of the main element constituting the wiring, and a solvent for the complex, thereby permitting the surface of the wiring to be recessed to form a recessed portion;

forming a second barrier layer on the wiring as well as on the insulating layer to thereby fill the recessed portion with the second barrier layer; and performing a flattening treatment of a surface of the second barrier layer until the surface of the insulating layer is exposed, thereby leaving the second barrier layer inside the recessed portion.

Furthermore, according to the present invention, there is also provided a semiconductor device which comprises:

an insulating layer which is provided with a groove and formed on a semiconductor substrate;

a first barrier layer formed on an inner surface of the groove of the insulating layer;

a wiring which is formed inside the groove of the insulating layer and whose surface is recessed lower than the insulating layer; and a second barrier layer formed on the wiring;

wherein an angle between the surface of the wiring and the first barrier layer at a sidewall of the groove is 60° or more.

Furthermore, according to the present invention, there is also provided an etching solution for etching copper or a copper alloy, which comprises:

an oxidizing agent of 0.01 to 10 mol/L which is reactive to copper;

a complex forming agent of 0.0001 to 1 mol/L which is capable of forming a complex together with copper ion; and a solvent for the complex.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1A:
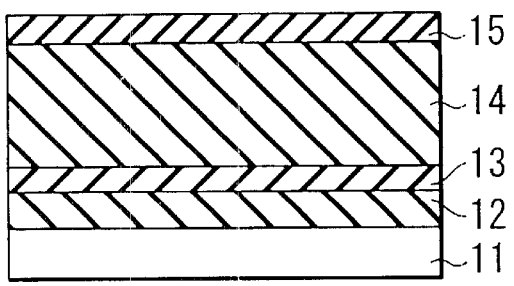
FIGS. 1A to 1H are cross-sectional views for illustrating the process of manufacturing a semi-conductor device according to a first example of this invention.

A first embodiment of this invention is featured in that an intermediate layer is formed on an insulating layer in which a wiring layer is buried, thereby making it possible to cancel any step to be formed between the upper surface of a second barrier layer and the upper surface of the insulating layer.

Namely, since the first embodiment of this invention is featured in that an intermediate layer which can be removed by a different method from that to be employed for removing the insulating layer is formed in advance on the surface of the insulating film and then, the intermediate layer is removed after a predetermined chemical mechanical polishing in the process wherein a recess etching to recess (sink) the surface of the wiring to a level lower than the level of the surface of the insulating layer is performed first and, after a barrier layer is deposited all over the surface, the barrier layer (a second barrier layer) is left remaining on only the upper surface of the wiring by making use of the chemical mechanical polishing, it is now possible, even if the magnitude of the recess (the quantity of an upper portion of the wiring that will be removed) is increased for the purpose of securing a sufficient residual film thickness of the barrier layer, to prevent any step from being formed between the upper surface of the second barrier and the upper surface of the insulating layer.

As a result, it becomes possible to overcome the problems originating from the generation of the aforementioned step such as a defective step coverage that may be developed in a subsequent processing. It is also possible according to this first embodiment to suppress the capacitance between intra-level wirings from being increased.

After the intermediate layer has been removed, the chemical mechanical polishing is performed under the condition where the second barrier layer can be polished, thereby enabling the second barrier layer that has been formed on the sidewall of the recessed portion to be removed. Since the time required for this chemical mechanical polishing is relatively short as compared with the ordinary chemical mechanical polishing, the second barrier layer formed on the wiring would be hardly affected by this chemical mechanical polishing.

As for the intermediate layer, it is possible to employ a film selected from the group consisting of a carbon film, a silicon nitride film, a silicon oxide film, and a laminate film consisting of two or more of the these films.

Although there is not any particular limitation with respect to the thickness of the intermediate layer, it is preferable to confine it to the range of 10 to 200 nm.

The wiring layer according to this first embodiment of this invention can be selected from the group consisting of Cu, Ag, Au, Pt and alloys containing any of these metals (the same in the following second to fifth embodiments).

A second embodiment of this invention is featured in that a second barrier layer is formed on the surface of wiring layer by means of an electro-plating method.

Namely, since this second embodiment of this invention is featured in that the first barrier layer or a conductive layer is continuously left in a region extending from the sidewall of the wiring layer to all over the insulating layer in the flattening step of the wiring layer, the first barrier layer or the conductive layer can be utilized as one of the electrodes, thereby making it possible to form a barrier layer on the wiring by making use of an electro-plating process which is inexpensive and high in processing speed. In this case, the range of metals that can be utilized in this method is very extensive as compared with that employable in an electro-less plating method. Furthermore, since the entire process of forming the wiring by means of the damascene method can be performed in a wet system, the wiring-forming process can be continuously executed using the same apparatus, thereby making it possible to form a wiring inexpensively, at a high speed and in a simple process.

In this second embodiment of the invention, it is preferable that not only the second barrier layer but also the wiring layer is formed by means of the electro-plating method.

Although there is not any particular limitation with respect to the conditions of the electro-plating, it is preferable to execute the plating at a current density of 1 mA/cm$^2$ to 50 mA/cm$^2$.

A third embodiment of this invention is featured in that an etching solution comprising an oxidizing agent which is reactive to main element constituting the wiring, a complex forming agent which is capable of forming a complex together with ions of the main element constituting the wiring, and a solvent for the complex is employed in the recess etching of the wiring.

As for the main element constituting the wiring in this third embodiment of the invention, it may be any one of Cu, Ag, Au or Pt.

As for the oxidizing agent, it is possible to employ at least one kind of material selected from the group consisting of an aqueous solution of hydrogen peroxide, ammonium peroxosulfate and an aqueous solution of ozone. As for the complex forming agent, it is possible to employ at least one kind of material selected from the group consisting of amino acid, ethylene-diamine, ethylene-diamine-tetraacetic acid and aminosulfonic acid. As for the amino acid, glycine is preferable.

As for the solvent, it is possible to employ water.

As for the specific composition of the etching solution, it is preferable to employ a composition comprising 0.01 to 10 mol/L of the aforementioned oxidizing agent, which is reactive to copper, and 0.0001 to 1 mol/L of the aforementioned complex forming agent, which is capable of forming a complex together with copper ions.

It is preferable that the recess etching treatment is continuously performed inside a flattening device employed in the preceding step of flattening treatment. Alternatively, the recess etching treatment can be preferably performed inside a processing chamber employed in a washing step to be performed subsequent to the preceding step of flattening treatment.

The mechanism of the method according to this third embodiment of the invention can be explained as follows.

Namely, when the recess etching treatment of the wiring is performed using an etching solution comprising an oxidizing agent for the main element constituting the wiring, a complex forming agent which is capable of forming a complex together with ions of the main element constituting the wiring, and a solvent for the complex, the etching will be proceeded according to the following steps.

(1) Due to the reaction between the oxidizing agent and this main constituent element of the wiring, this main constituent element is ionized.

(2) Due to the reaction between this ionized main constituent element and the complex forming agent, a complex of the main constituent element is formed.

(3) The complex thus formed is dissolved by the solvent and removed.

When these three steps are concurrently proceeded, the recess etching is allowed to proceed uniformly from the surface of the wiring, and at the same time, it is possible to eliminate the dependency of the magnitude of recess on the region within a wafer as well as the dependency of the magnitude of recess on the configuration of wiring pattern.

Since the recess etching is allowed to proceed uniformly from the surface of the wiring, it becomes possible to secure a sufficient coverage by the second barrier layer at the sidewall of the wiring, thereby making it possible to inhibit the oxidation or diffusion of the element constituting the wiring during the subsequent processes and hence to prevent the deterioration of yield. Furthermore, since the dependency of the magnitude of recess on the region within a wafer as well as the dependency of the magnitude of recess on the configuration of wiring pattern can be eliminated as mentioned above, it is now possible to prevent the resistance of wiring from being varied depending on the region within a wafer as well as on the configuration of wiring pattern, thus making it possible to obtain a desired performance of the semiconductor device.

A fourth embodiment of this invention is featured in that an angle between the surface of the wiring and the first barrier layer at a sidewall of the groove is confined to 60° or more.

In this case, what is meant by the expression of "an angle between the surface of the wiring and the first barrier layer at a sidewall of the groove" is an angle at the contact point between the upper surface of the wiring and the sidewall of the first barrier layer, so that when the contact portion between them is not linearly constituted, there may be existed a plural number of angles. If so, the angle would be defined by a minimum value of the plural angles.

Although there is not any particular limitation with respect to the upper limit of this angle, the range of the angle should preferably be confined to 90° or less. Because, if this angle exceeds 90°, the thickness of the barrier layer would become too thin at this end portion.

A fifth embodiment of this invention is featured in that an etching solution having the aforementioned composition and adapted to be used for the aforementioned recess etching is provided.

Next, various examples of this invention will be explained with reference to the drawings. In the following examples, Examples 1 and 2 are directed to the first embodiment of this invention, Examples 3 and 4 are directed to the second embodiment of this invention, and Examples 5 and 6 are directed to the third to fifth embodiments of this invention.

EXAMPLE 1

FIGS. 1A to 1H respectively shows a cross-sectional view illustrating the process of manufacturing a semiconductor device according to the first example of this invention.

First of all, as shown in FIG. 1A, a thermal oxide film 12 having a thickness of 100 nm was formed on the surface of a silicon substrate (semiconductor substrate) 11. Then, a silicon nitride film 13 having a thickness of 30 nm and a silicon oxide film 14 having a thickness of 400 nm were successively deposited on the thermal oxide film 12 by means of a CVD method. Thereafter, a carbon film (intermediate layer) 15 having a thickness of 100 nm was deposited on the silicon oxide film 14.

Figure 1B:
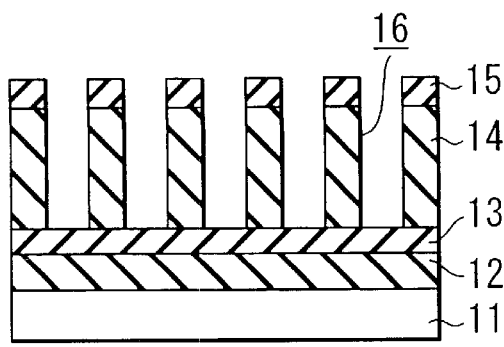

Next, as shown in FIG. 1B, the carbon film 15 was made into a pattern by making use of the ordinary PEP and etching process, and then, a groove 16 was formed by means of RIE using this carbon film 15 as a mask. The groove 16 thus formed was formed of a pattern 3m in length and 0.2/0.2 $\mu$m in Line/Space, thereby enabling both ends of the wiring to be connected with electrode pads, respectively.

Figure 1C:
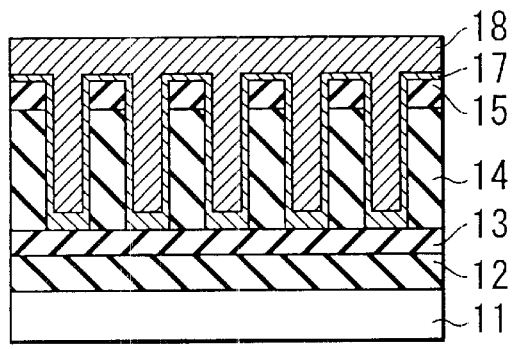

Then, as shown in FIG. 1C, a first TaN film (a first barrier layer) 17 having a thickness of 20 nm was deposited all over the upper surface of the substrate including the inner surface of the groove 16 by means of sputtering method. Additionally, after a Cu film having a thickness of 200 nm was deposited on the first TaN film 17, a Cu film was additionally deposited all over the surface of the substrate by means of electro-plating method using copper sulfate as an electrolytic solution to form a Cu-wiring layer 18 so as to fill the groove 16 with Cu.

Figure 1D:
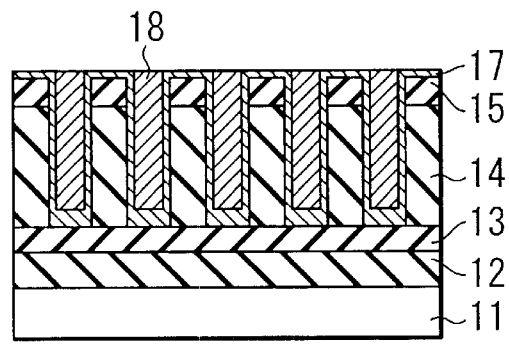

Then, as shown in FIG. 1D, the surface of the Cu-wiring layer 18 was subjected to a CMP treatment using the first TaN film 17 as a stopper until the first TaN film 17 was exposed.

Figure 1E:
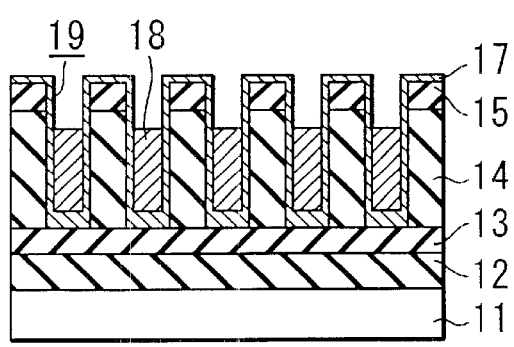

Thereafter, as shown in FIG. 1E, the wafer was mounted on a spin etcher and then, subjected to an etching treatment using an acid while rotating the wafer at a high-speed, thereby causing the surface of the Cu-wiring 18 to depress downward (lowering the level of the surface of the Cu-wiring layer 18), thus forming a recessed portion 19. After this etching treatment, the surface of the substrate was rinsed for 5 minutes with pure water and then, dried. The recessed portion 19 thus formed had a depth of 150 nm, and the cross-sectional features of the resultant sample substrate was found excellent.

Figure 1F:
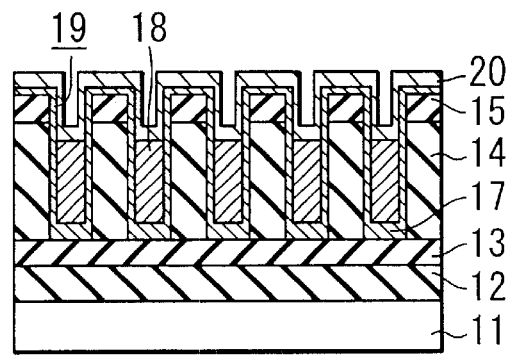
Figure 1G:
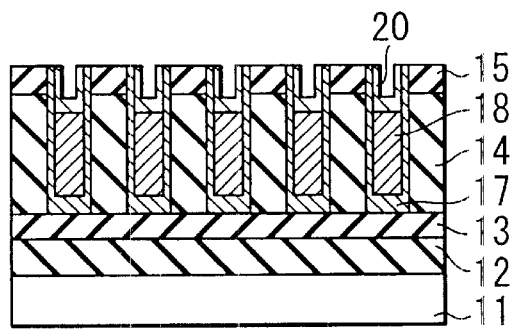

Then, as shown in FIG. 1F, a second TaN film 20 having a thickness of 50 nm was deposited all over the surface of substrate by means of sputtering method. Subsequently, as shown in FIG. 1G, the second TaN film 20 and the first TaN film 17 both disposed over the carbon film 15 were removed by way of chemical mechanical polishing (CMP), thereby allowing the carbon film 15 on the field to be exposed throughout the entire surface of the wafer. Since the depth of the recessed portion 19 was larger than the film thickness of the second TaN film 20, the second TaN film 20 disposed over the Cu-wiring 18 was allowed to remain thereon with a sufficient film thickness thereof being maintained throughout the entire surface of the wafer.

Figure 1H:
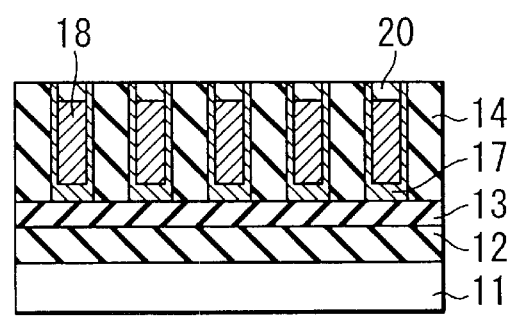

Finally, as shown in FIG. 1H, the carbon film 15 was removed by means of CDE using a $O_2$ gas. Further, for the purpose of removing the residual of TaN film that had been attached to the sidewall of the recessed portion, a polishing treatment was conducted for 10 seconds by making use of a slurry which was suited for use in the chemical mechanical polishing (CMP) of TaN film. Since this treatment could be performed within a relatively short period of time as compared with the time required in the ordinary chemical mechanical polishing (CMP), only the residual of TaN film that had been attached to the sidewall of the recessed portion could be removed without badly affecting the TaN film disposed on the Cu-wiring.

In this example, although the chemical mechanical polishing (CMP) employed prior to the etching treatment for forming the recessed portion was stopped at the stage when the first TaN film 17 was exposed, the silicon oxide film 14 could have been also exposed prior to the etching treatment.

The wafer thus treated was then measured with regard to the resistance of the wiring thereof by making use of a prober, and then, further subjected to an accelerated test wherein the wafer was left to stand for one hour in an oven filled therein with air atmosphere heated to 300° C. When the electric resistance of the Cu-wiring was measured again by making use of the prober after this accelerated test, no change in electric resistance could be recognized in the values measured before and after this accelerated test. It was confirmed from this result that the barrier layer functioned effectively as an oxidation preventive layer.

Further, an insulating film was coated on the surface of the wafer bearing thereon a large number of wiring patterns, and then, the annealing of the wafer was performed for 60 hours at a temperature of 450° C. When the insulating film thus coated was dissolved to measure the concentration of Cu, no substantial difference in the values between the wafers measured before and after this annealing could be found. It was confirmed from this result that the upper barrier layer functioned effectively as a Cu diffusion preventive layer.

When a silicon oxide film and an upper wiring were successively formed according to the conventional process on the wafer that had been fabricated in the same manner as mentioned above, it was found possible to obtain a desired property without raising any problem.

As for the intermediate layer, a silicon nitride film or a silicon oxide film can be employed other than the aforementioned carbon film.

EXAMPLE 2

FIGS. 2A to 2H respectively shows a cross-sectional view illustrating the process of manufacturing a semiconductor device according to the second example of this invention.

Figure 2A:
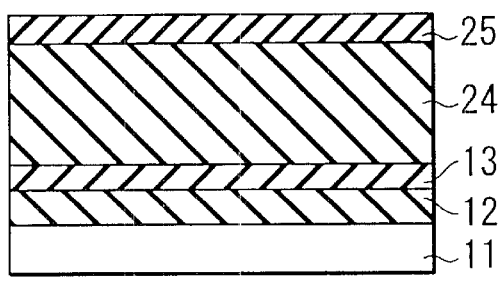
FIGS. 2A to 2H are cross-sectional views for illustrating the process of manufacturing a semi-conductor device according to a second example of this invention.

First of all, as shown in FIG. 2A, a thermal oxide film 12 having a thickness of 100 nm was formed on the surface of an Si substrate (semiconductor substrate) 11. Then, a silicon nitride film 13 having a thickness of 30 nm was deposited on the thermal oxide film 12 by means of a CVD method and a low dielectric insulating film 24 having a thickness of 400 nm was formed on the silicon nitride film 13 by coating method. This low dielectric insulating film 24 was formed of a silicon oxide having a large number of methyl groups in its skeleton and was resistive to hydrofluoric acid. Thereafter, a silicon oxide film (intermediate layer) 25 having a thickness of 100 nm was deposited on the low dielectric insulating film 24.

Figure 2B:
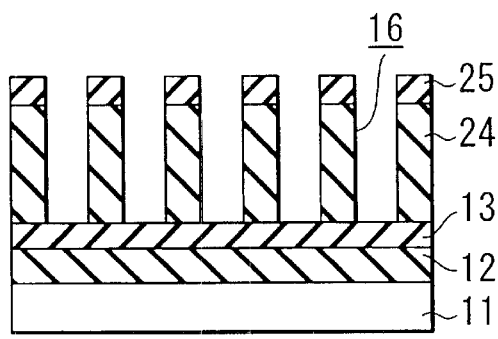

Next, as shown in FIG. 2B, a groove 16 was formed in the silicon oxide film 25 as well as the low dielectric insulating film 24 by making use of the ordinary PEP and etching process. The groove 16 thus formed was formed of a pattern 3 m in length and 0.2/0.2 $\mu$m in Line/Space, thereby enabling both ends of the wiring to be connected with electrode pads, respectively.

Figure 2C:
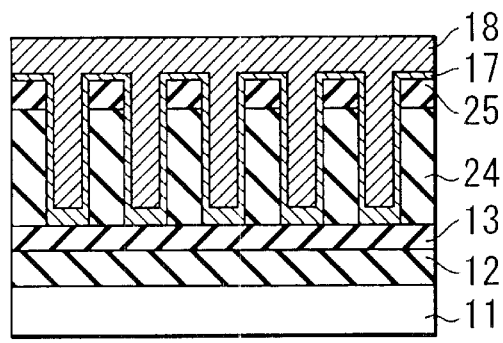

Then, as shown in FIG. 2C, a first TaN film (a first barrier layer) 17 having a thickness of 20 nm was deposited on the upper surface of the substrate by means of sputtering method. Additionally, after a Cu film having a thickness of 200 nm was deposited on the first TaN film 17, a Cu film was additionally deposited all over the surface of the substrate by means of electro-plating method using copper sulfate as an electrolytic solution to form a Cu-wiring layer 18 so as to fill the groove 16 with Cu.

Figure 2D:
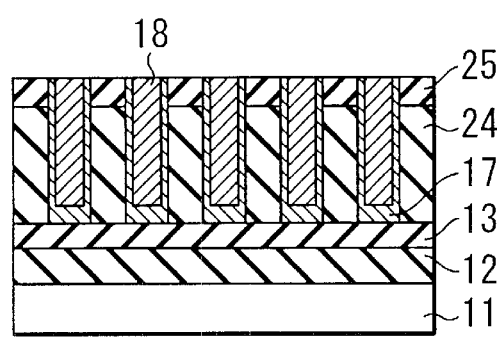

Then, as shown in FIG. 2D, the surface of the Cu-wiring layer 18 was subjected to a CMP treatment using the first TaN film 17 as a stopper until the first TaN film 17 was exposed. Thereafter, the surface of the substrate was further subjected to additional CMP treatment, thereby allowing the silicon oxide film 25 to be exposed.

Figure 2E:
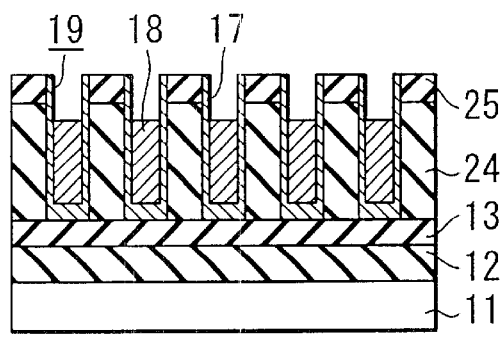

Thereafter, as shown in FIG. 2E, the wafer was mounted on a spin etcher and then, subjected to an etching treatment using an acid while rotating the wafer at a high-speed, thereby causing the surface of the Cu-wiring 18 to depress downward, thus forming a recessed portion 19. After this etching treatment, the surface of the substrate was rinsed for 5 minutes with pure water and then, dried. The recessed portion 19 thus formed had a depth of 150 nm, and the cross-sectional features of the resultant sample substrate was found excellent.

Figure 2F:
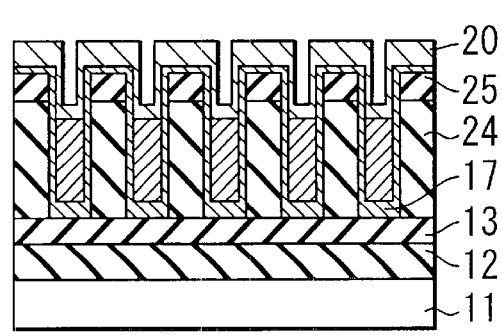
Figure 2G:
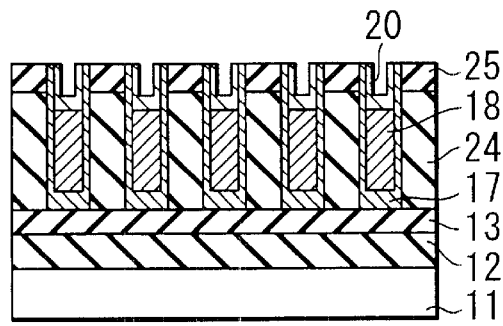

Then, as shown in FIG. 2F, a second TaN film 20 having a thickness of 50 nm was deposited all over the surface of substrate by means of sputtering method. Subsequently, as shown in FIG. 2G, the second TaN film 20 disposed over the silicon oxide film 25 was removed by way of chemical mechanical polishing (CMP), thereby allowing the silicon oxide film 25 on the field region to be exposed throughout the entire surface of the wafer. Since the depth of the recessed portion 19 formed by the etching of the Cu-wiring 18 was larger than the film thickness of the second TaN film 20, the second TaN film 20 disposed over the Cu-wiring 18 was allowed to remain thereon with a sufficient film thickness thereof being maintained throughout the entire surface of the wafer.

Figure 2H:
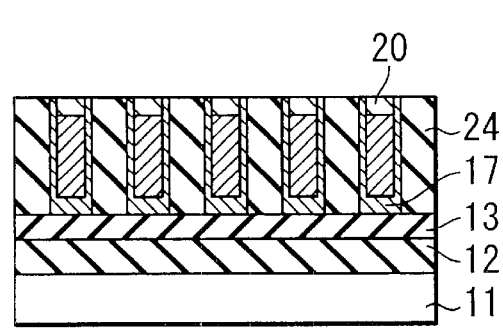

Finally, as shown in FIG. 2H, the silicon oxide film 25 was removed by making use of hydrofluoric acid. Further, for the purpose of removing the residual of TaN film that had been formed on the sidewall of the recessed portion, a polishing treatment was conducted for 10 seconds by making use of a slurry which was suited for use in the chemical mechanical polishing (CMP) of TaN film. Since this treatment could be performed within a relatively short period of time as compared with the time required in the ordinary chemical mechanical polishing (CMP), only the residual of TaN film that had been attached to the sidewall of the recessed portion could be removed without badly affecting the second TaN film 20 disposed on the Cu-wiring 18.

When the same tests as conducted in the first example were repeated in this example, it was possible to confirm that the semiconductor device thus obtained was provided with an excellent oxidation resistance, an excellent Cu barrier property and an excellent consistency with the subsequent processing.

EXAMPLE 3

In this example, the barrier layer formed below the wiring in a midway of process was utilized as a conductive layer for the electro-plating. Further, a copper wiring was employed in this example.

FIGS. 3A to 3F respectively shows a cross-sectional view illustrating the process of manufacturing a semiconductor device according to the third example of this invention.

Figure 3A:
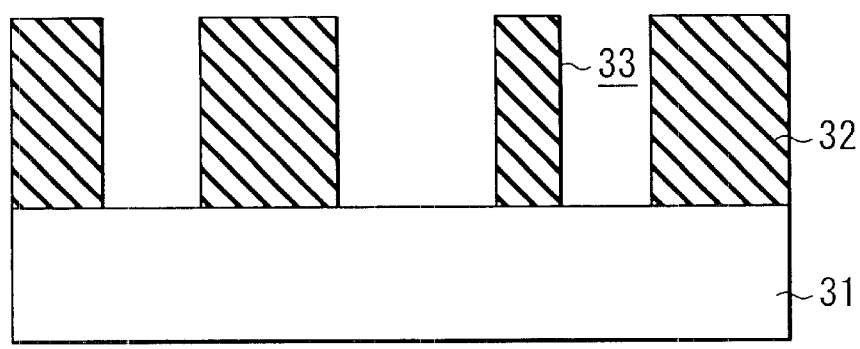
FIGS. 3A to 3F are cross-sectional views for illustrating the process of manufacturing a semi-conductor device according to a third example of this invention.
Figure 3B:
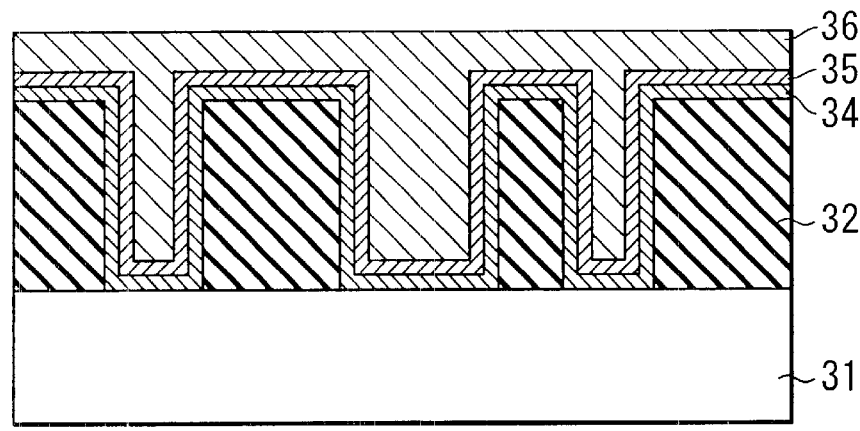

First of all, as shown in FIG. 3A, a groove 33 having a depth of 450 nm was formed in an interlayer insulating film 32 which was formed in advance on an Si substrate 31. Then, as shown in FIG. 3B, a TaN (tantalum nitride) film (a first barrier layer) 34 having a thickness of 20 nm was formed as a barrier layer by means of sputtering method. Further, after a sputtered copper film 35 having a thickness of 100 nm was formed by means of sputtering method, an electroplated copper film 36 having a thickness of 900 nm was formed using the sputtered copper film 35 as a conductive layer. In the following explanation, these sputtered copper film 35 and electroplated copper film 36 will be referred to as copper wiring layers 35 and 36, respectively.

The conditions for the electro-plating were as follows;

Plating bath: copper sulfate solution;

Temperature of plating bath: room temperature;

Current density: 20 mA/cm$^2$.

Figure 3C:
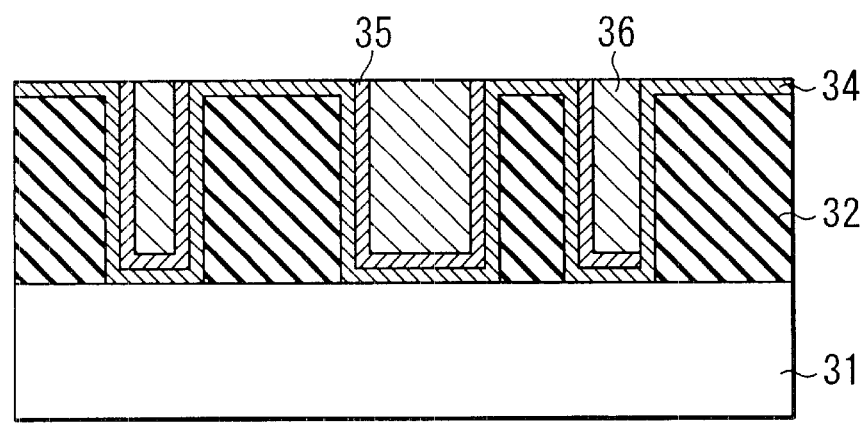

Then, as shown in FIG. 3C, excessive portions of the copper wiring layers 35 and 36 which were deposited on the TaN film 34 were removed by means of the CMP method (damascene method). The slurry employed in this CMP step contained silicon oxide as an abrasive powder and also ammonium peroxosulfate. Since the speed of removing TaN was as slow as one-tenth of the speed of removing copper in this CMP step, the removal of these sputtered copper film 35 and electro-plated copper film 36 could be accomplished while allowing the TaN film 34 to be left as it was.

Figure 3D:
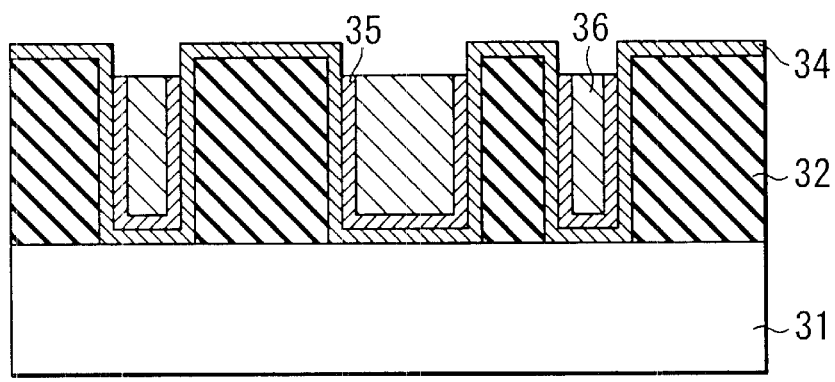

Then, as shown in FIG. 3D, only the copper was selectively etched away by making use of an etching solution consisting of a mixed solution comprising hydrochloric acid and an aqueous solution of hydrogen peroxide, thereby causing the top surfaces of these copper wiring layers 35 and 36 to be recessed to a depth of about 100 nm.

Under this condition, the TaN film 34 left between units of copper wiring layers 35 and 36 was utilized as a conductive layer in the following step of electro-plating, which was performed using an electro-plating solution consisting of an aqueous solution of ruthenium chloride pentahydrate and by applying a negative potential from the vicinity of outer periphery of the wafer to the TaN film 34. In this electro-plating, a ruthenium plate was employed as an anode to be positioned in the plating solution.

Figure 3E:
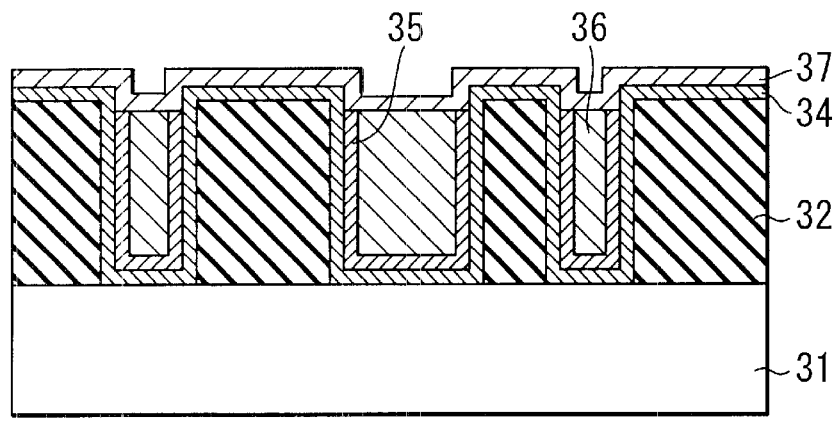

As a result of this electro-plating, a ruthenium film (a second barrier layer) 37 having a uniform thickness of 50 nm was formed on the surface of the wafer as shown in FIG. 3E. Ruthenium is known to be effective as a diffusion barrier (barrier film) against copper, so that when ruthenium is formed on the wiring layers 35 and 36, the thermal diffusion of copper into the interlayer insulating film can be prevented.

Figure 3F:
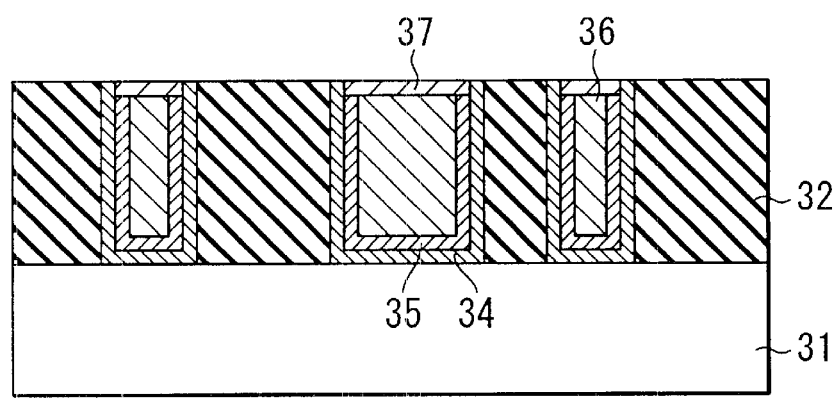

Thereafter, as shown in FIG. 3F, those portions of the ruthenium film 37 and TaN film 34 which were disposed over the interlayer insulating film 32 were removed by means of the CMP, thereby fabricating units of the wirings 35 and 36, each unit being covered by the TaN film 34 and the ruthenium film 37, wherein the TaN film 34 was attached to the bottom and sidewalls of the unit and the ruthenium film 37 was attached to the top surface of the unit.

By the way, it is also possible, if desired, to further improve the barrier property of the ruthenium film 37 by subjecting the surface or interior of the ruthenium film 37 to a nitriding treatment by means of a nitrogen plasma, to a boriding treatment, to a carbonizing treatment, or to a siliciding treatment. Additionally, since the ruthenium oxide is electrically conductive, the ruthenium film 37 can be subjected to an oxidizing treatment.

EXAMPLE 4

FIGS. 4A to 4F respectively shows a cross-sectional view illustrating the process of manufacturing a semiconductor device according to the fourth example of this invention.

Figure 4A:
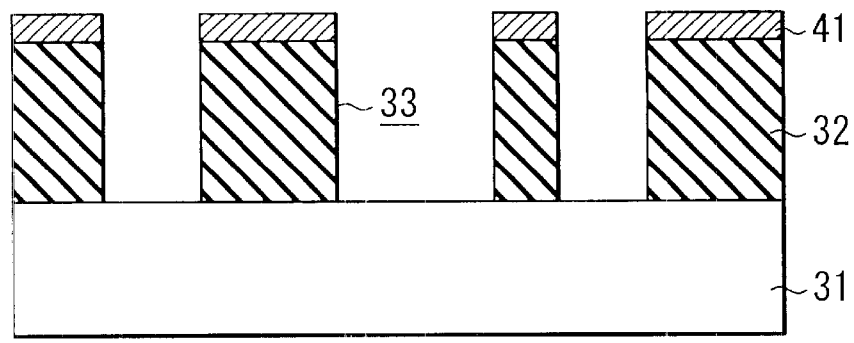
FIGS. 4A to 4F are cross-sectional views for illustrating the process of manufacturing a semi-conductor device according to a fourth example of this invention.

First of all, as shown in FIG. 4A, prior to the formation of a groove 33 (1400 nm in depth) in an interlayer insulating film 32, a tungsten film 41 having a thickness of 80 nm was formed as a conductive hard mask on the top surface of the interlayer insulating film 32. Thereafter, a photoresist film (not shown) was formed on the tungsten film 41, and a pattern of groove was formed in this photoresist film by means of the ordinary lithography to thereby obtain a photoresist pattern. Then, by making use of this photoresist pattern as a mask, a groove 33 was formed by etching the tungsten film 41 and the interlayer insulating film 32 by means of a dry etching method.

If this photoresist is lost in the midway of this dry etching, the tungsten film 41 thus patterned can be utilized as a mask, thereby enabling to continue the groove-forming work into the interlayer insulating film. If the photoresist is still left remained after finishing this dry etching step, the photoresist can be removed.

Figure 4B:
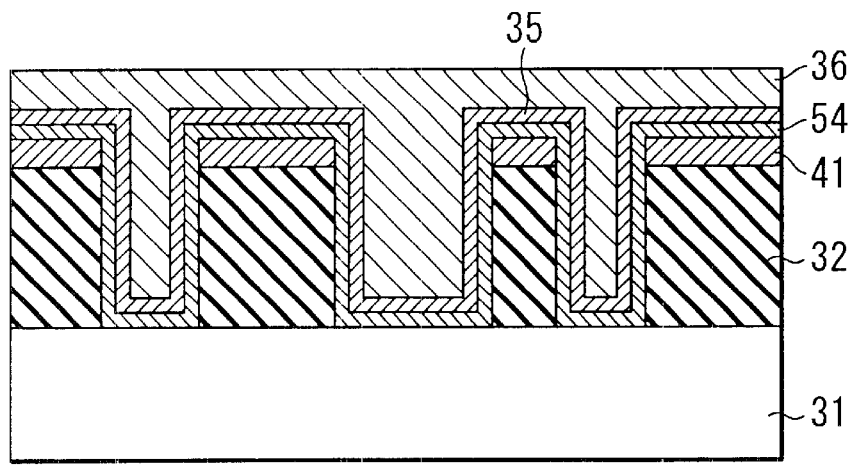

Then, as shown in FIG. 4B, a TiN (titanium nitride) film 54 having a thickness of 50 nm was formed as a barrier layer on the entire surface of the substrate including the inner surface of the groove 33 by means of a sputtering method. Furthermore, after a sputtered copper film 35 having a thickness of 200 nm was formed by means of sputtering method, an electroplated copper film 36 having a thickness of 1700 nm was formed utilizing the sputtered copper film 35 as a conductive layer for the electro-plating.

The conditions for the electro-plating were as follows;
Plating bath: copper sulfate solution;
Temperature of plating bath: room temperature;
Current density: 20 mA/cm².

Figure 4C:
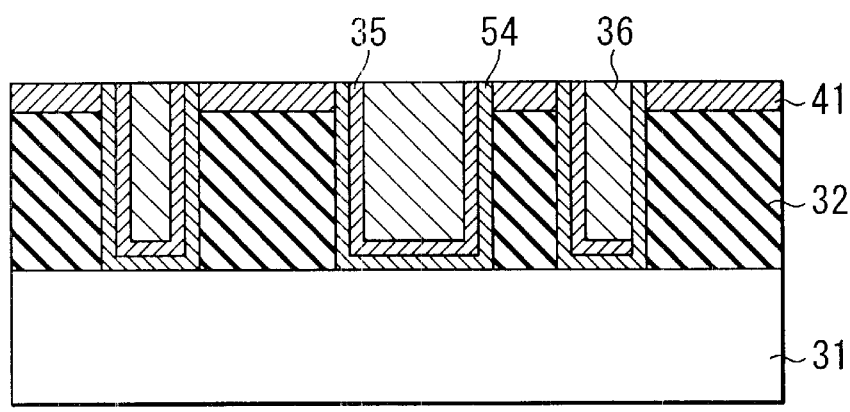

Then, as shown in FIG. 4C, excessive portions of the copper layer 35 and the electro-plated copper film 36 which were deposited on the TIN film 54 were removed by means of the CMP method (damascene method). The slurry employed in this CMP step contained silicon oxide as an abrasive powder and also ammonium peroxosulfate. Since the speed of removing tungsten was as slow as one-twentieth of the speed of removing copper in this CMP step, the removal of these sputtered copper film 35 and electrolytically plated copper film 36 could be accomplished while allowing the tungsten film 41 to be left as it was. In this case, the TIN film 54 may be partially left intact.

Figure 4D:
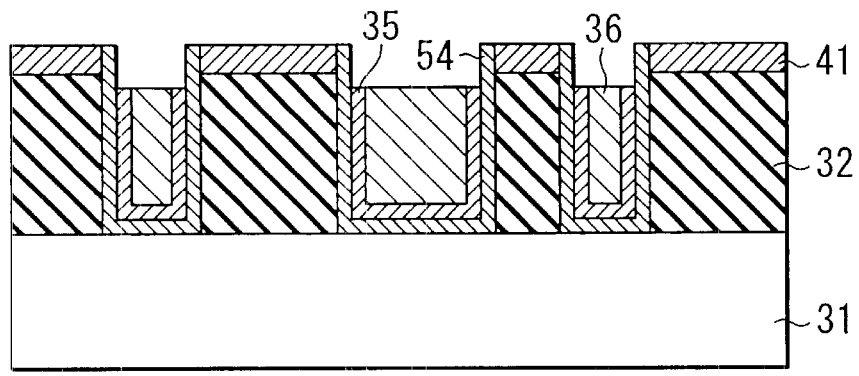

Then, as shown in FIG. 4D, only the copper was selectively etched away by making use of an etching solution consisting of a mixed solution comprising hydrochloric acid and an aqueous solution of hydrogen peroxide, thereby causing the top surfaces of these sputtered copper film 35 and electrolytically plated copper film 36 to be recessed to a depth of about 300 nm.

Under this condition, the tungsten film 41 left between units of these copper wiring layers 35 and 36 was utilized as a conductive layer in the following electro-plating step, which was performed using an aqueous solution of rhodium sulfate and by applying a negative potential from the vicinity of outer periphery of the wafer to the tungsten film 41. In this electro-plating, a platinum plate was employed as an anode to be positioned in the plating solution.

Figure 4E:
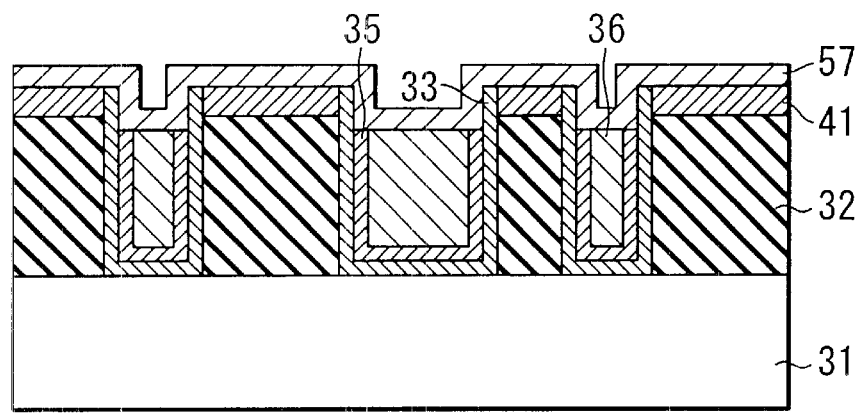

As a result of this electro-plating, a rhodium film 57 having a uniform thickness of 50 nm was formed on the surface of the wafer as shown in FIG. 4E. Rhodium is known to be effective as a diffusion barrier (barrier film) against copper, so that when rhodium is formed on these wiring layers, the thermal diffusion of copper into the interlayer insulating film can be prevented.

Figure 4F:
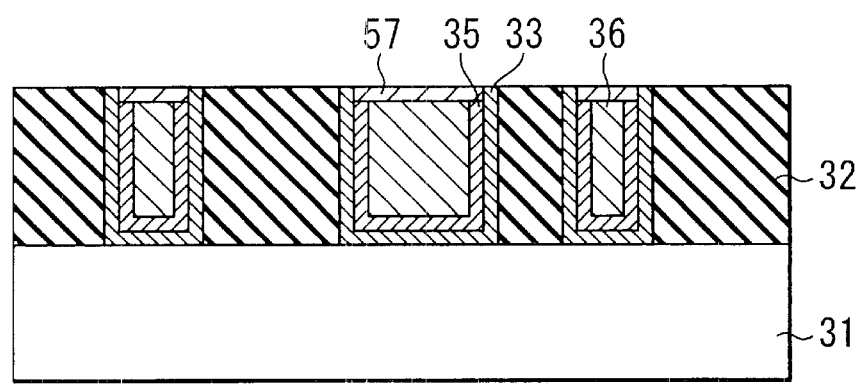

Thereafter, as shown in FIG. 4F, those portions of the rhodium film 57, the tungsten film 41, and TiN film 54 which were disposed over the interlayer insulating film were removed by means of the CMP, thereby fabricating copper wires each being covered by the TiN film 54 and the rhodium film 57, wherein the TiN film 54 was attached to the bottom and sidewalls of the unit and the rhodium film 57 was attached to the top surface of each copper wire.

By the way, it is also possible, if desired, to further improve the barrier property of the rhodium film 57 by subjecting the surface or interior of the rhodium film 57 to a nitriding treatment by means of a nitrogen plasma, to a boriding treatment, to a carbonizing treatment, or to a siliciding treatment.

As explained above, according to the first embodiment of this invention, since an intermediate layer which can be removed by a different method from that to be employed for removing the insulating layer is formed in advance on the surface of the insulating film and then, the intermediate layer is removed after a predetermined chemical mechanical polishing in the process wherein a recess etching to depress the surface of the wiring to a level lower than the level of the surface of the insulating layer is performed at first and, after a barrier layer is deposited all over the surface, the barrier layer is left on only the upper surface of the wiring by making use of the chemical mechanical polishing, it is now possible, even if the magnitude of the recess is increased for the purpose of securing a sufficient residual film thickness of the barrier layer, to prevent any step from being formed between the upper surface of the barrier layer on the wiring and the upper surface of the insulating layer, thereby making it possible to overcome the problems originating from the generation of the step such as a defective step coverage by the insulating film that may be developed in a subsequent processing.

Further, according to the second embodiment of this invention, since the barrier layer or a conductive layer is continuously left so as to cover the sidewall of the wiring disposed over the insulating layer in the flattening step of the wiring layer, a barrier layer can be formed on the wiring layer by making use of an electro-plating process which is inexpensive and high in processing speed, thereby making it possible to utilize various kinds of metals in this method as compared with those that can be utilized in an electroless plating method. Furthermore, since the entire process of forming the wiring by means of the damascene method can be performed in a wet system, the wiring-forming process can be continuously executed using the same apparatus, thereby making it possible to form a wiring inexpensively, at a high speed and in a simple process.

The following example is related to the third embodiment of this invention.

EXAMPLE 5

FIGS. 5A to 5H respectively shows a cross-sectional view illustrating the process of manufacturing a semiconductor device according to the fifth example of this invention.

Figure 5A:
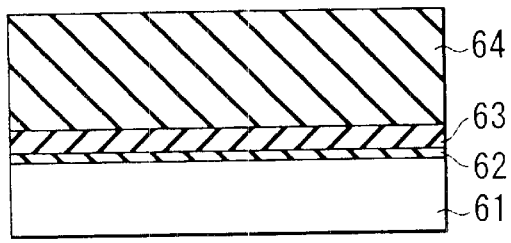
FIGS. 5A to 5H are cross-sectional views for illustrating the process of manufacturing a semi-conductor device according to a fifth example of this invention.

First of all, as shown in FIG. 5A, a thermal oxide film 62 having a thickness of 100 nm was formed on the surface of a silicon substrate 61. Then, a silicon nitride film 63 having a thickness of 30 nm and a silicon oxide film 64 having a thickness of 400 nm were successively deposited on the thermal oxide film 62 by means of a CVD method.

Figure 5E:
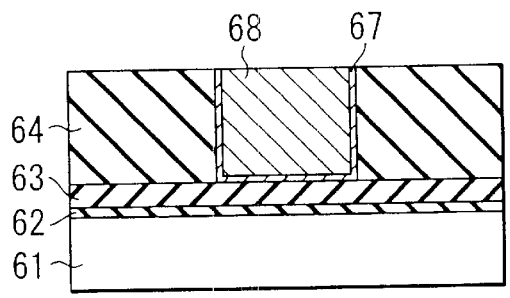
Figure 5B:
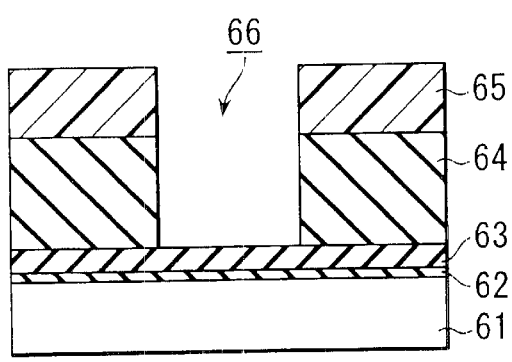

Next, as shown in FIG. 5B, a resist film 65 having an opening portion was formed on the silicon oxide film 64 by means of a lithography, and then, the silicon oxide film 64 was selectively etched away to thereby form a groove 66. The groove 66 thus formed was formed of a pattern 400 nm in depth and 3 m in repeatedly returned length.

Figure 5F:
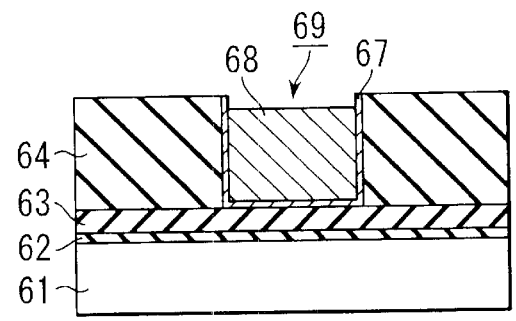
Figure 5C:
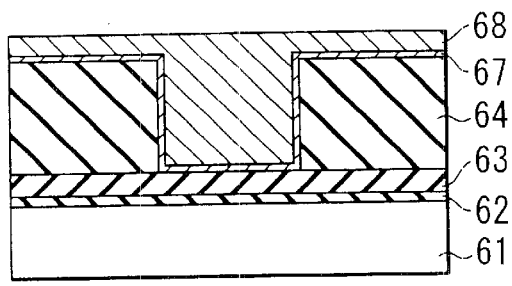

Then, as shown in FIG. 5C, after the resist film 65 was removed, a TaN film (a first barrier layer) 67 having a thickness of 20 nm and a Cu film having a thickness of 200 nm were successively deposited all over the upper surface of the substrate by means of sputtering method, after which a Cu film was additionally deposited all over the surface of the substrate by means of electro-plating method using copper sulfate as an electrolytic solution to form a Cu-wiring layer 68 so as to fill the groove 66 with Cu.

Figure 5G:
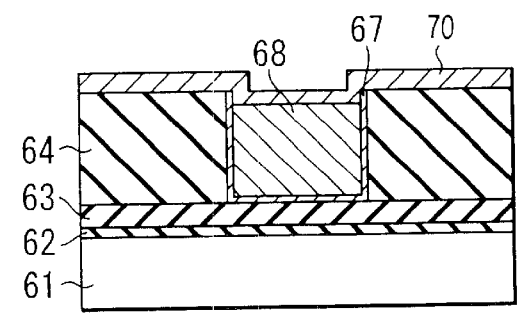
Figure 5D:
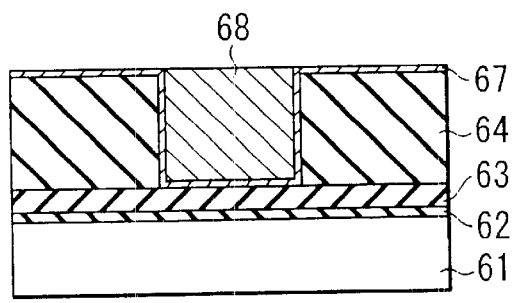

Then, as shown in FIG. 5D, the surface of the Cu-wiring layer 68 was subjected to a CMP treatment using the TaN film 67 as a stopper. Thereafter, as shown in FIG. 5E, the Cu-wiring layer 68 and the TaN film 67 were subjected to the CMP treatment until the surface of the silicon oxide film 64 was exposed, thereby obtaining the groove 66 which was filled with the Cu damascene wiring 68 and with the TaN film (first barrier layer) 67.

Thereafter, as shown in FIG. 5F, the Cu damascene wiring 68 was subjected to a recess etching treatment to form a recessed portion 69. This recess etching treatment to the Cu damascene wiring 68 was performed using an etching solution containing, based on 1000 cc of pure water employed as a solvent, 20 cc of a 35% aqueous solution of hydrogen peroxide which was obtained by dissolving hydrogen peroxide or an oxidizing agent in a solvent or water, and 1 g of glycine employed as a complex forming agent, this etching solution being fed to the surface of the Cu damascene wiring layer 68 for 50 seconds while allowing the Si substrate 61 to rotate at a high-speed by making use of a spin etcher. After finishing this recess etching treatment, the surface thus etched was subjected to a rinsing treatment by feeding pure water to the etched surface for 5 minutes while allowing the Si substrate 61 to rotate at a high-speed in the same manner as mentioned above, which was further followed by a drying step.

The recess etching treatment which was performed by feeding an etching solution consisting of glycine (a complex forming agent) and an aqueous solution of hydrogen peroxide (an oxidizing agent+a solvent) to the surface of Cu damascene wiring layer was assumed to be proceeded according to the following three steps.

(1) Due to the reaction between hydrogen peroxide as an oxidizing agent and Cu constituting the Cu damascene wiring, the surface of the wiring is ionized.

(2) Due to the reaction between this ionized surface of Cu damascene wiring and glycine as a complex forming agent, a complex of Cu is formed.

(3) The complex of Cu thus formed is dissolved by water employed as a solvent.

When these three steps are proceeded, the etching is allowed to proceed uniformly from the surface of the Cu damascene wiring.

Subsequently, as shown in FIG. 5G, the second TaN film (a second barrier layer) 70 was deposited so as to fill up the recessed portion 69 that had been formed by the aforementioned recess etching.

Figure 5H:
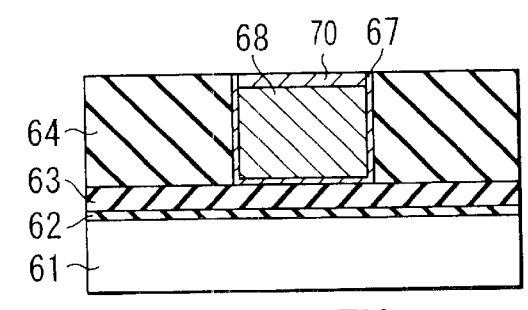

Then, as shown in FIG. 5H, the second TaN film 70 was subjected to the CMP treatment until the silicon oxide 64 was exposed, thereby obtaining the recessed portion 69 filled with the second TaN film (a second barrier layer) 70.

As a result of these steps, it was found possible to form a Cu damascene wiring which was surrounded and covered by the TaN film functioning as a barrier layer. Since the recess etching is allowed to proceed uniformly from the surface of the Cu damascene wiring 68 due to the fabrication of a multi-layer wiring by way of the aforementioned manufacturing process, it becomes possible to secure a sufficient coverage by the TaN film 70 at the sidewall of the Cu damascene wiring 68, thereby making it possible to inhibit the oxidation of the Cu damascene wiring 68 and to inhibit the diffusion of Cu constituting the Cu damascene wiring 68 during the subsequent processes, thus preventing the deterioration of yield. Furthermore, since the dependency of the magnitude of recess on the region within a wafer as well as the dependency of the magnitude of recess on the configuration of wiring pattern can be eliminated as mentioned above, it is now possible to prevent the resistance of wiring from being varied depending on the region within a wafer as well as on the configuration of wiring pattern, thus making it possible to obtain a desired performance of the semiconductor device.

Figure 6:
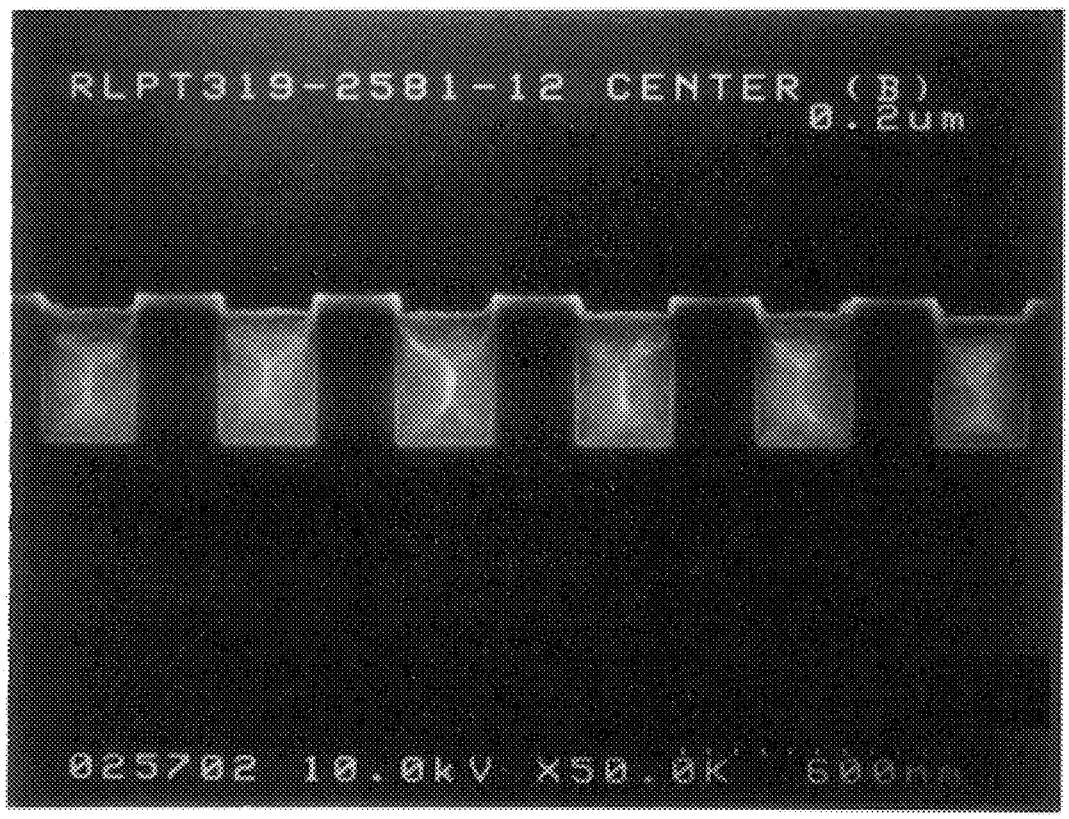
FIG. 6 is a photograph observed with scanning electron microscope showing the structure after a recess etching treatment.

FIG. 6 shows a photograph observed with scanning electron microscope showing a cross-sectional structure after the recess etching treatment. As seen from FIG. 6, no sinking can be found at the peripheral region of the Cu damascene wiring 68, thus indicating the uniformity of the recess etching treatment.

Figure 7:
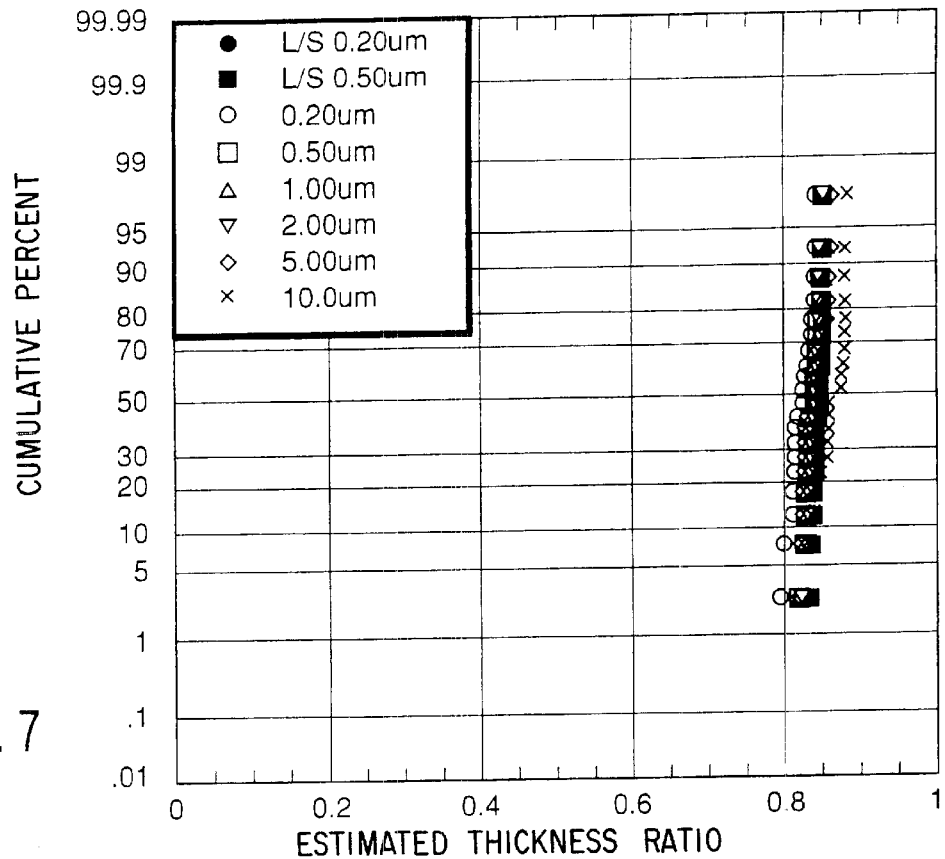
FIG. 7 is a graph illustrating the distribution of the magnitude of recess within a wafer where the recess etching treatment was performed using an etching solution according to this invention.

Next, the distribution of the magnitude of recess (the depth of the recessed portion which was formed in the recess etching) was measured, the results thereof being shown in FIG. 7. In this FIG. 7, the abscissa represents the ratio of the thickness of the wiring which was left remained after the recess etching relative to the thickness of the wiring existed before the recess etching. The thickness of the residual wiring was estimated from the measured results of the wiring resistance after the CMP treatment and of the wiring resistance after the recess etching treatment, which were obtained from the measurement using a prober, based on the assumption that the wiring was uniformly etched from the top surface thereof and hence, the electric resistance of wiring was increased due to the recess etching treatment.

In this case, the ratio of the residual wiring based on the wiring employed in this example and having a depth of 400 nm wherein Line/Space=0.2 μm/0.2 μm or 0.5 μm/0.5 μm was found as being about 0.85 at the center of the distribution of the ratio. This ratio was also the same in the isolated wiring having a dimension of 0.2 μm to 10 μm. This value corresponds to 60 nm in magnitude of recess etching as it is calculated based on the depth of wiring employed in this invention, i.e. 400 nm.

Figure 8:
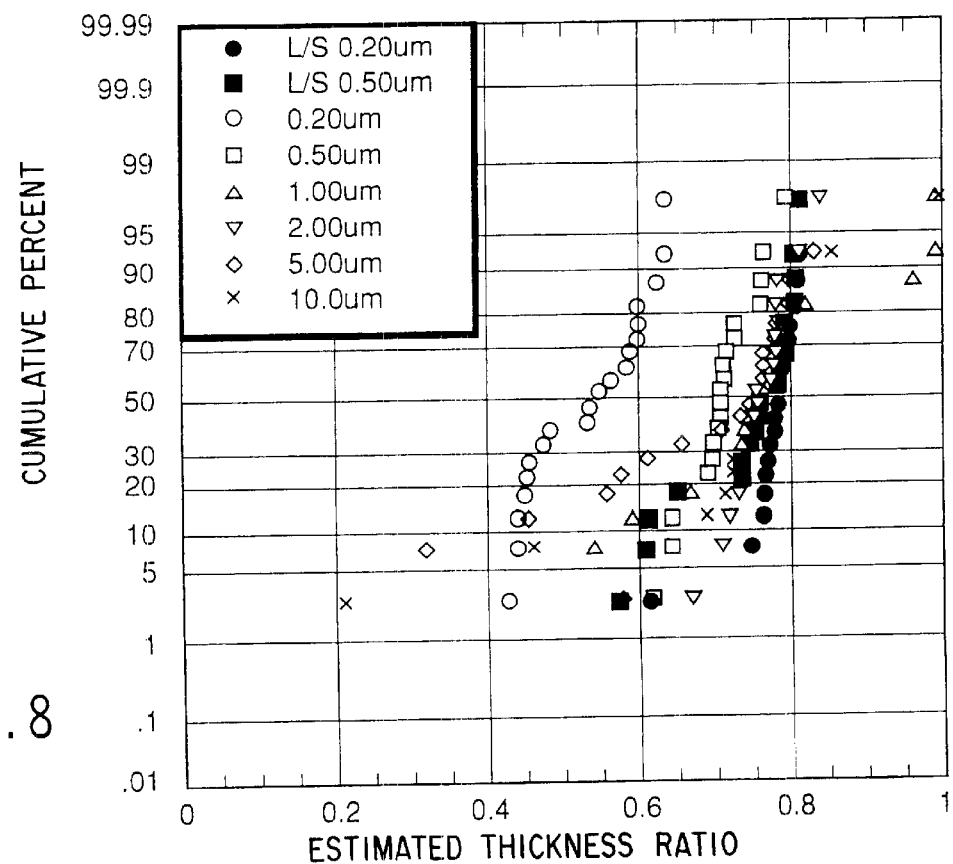
FIG. 8 is a graph illustrating the distribution of the magnitude of recess within a wafer where the recess etching treatment of a Cu-damascene wiring layer was performed using an acid.

FIG. 8 shows the result of a comparative example wherein the recess etching of the Cu-damascene etching treatment was performed using an acid. As shown in FIG. 8, the distribution of the magnitude of recess throughout the wafer was relatively extensive, and additionally, the magnitude of recess etching of the isolated 0.2 μm wiring was found relatively large as compared with other pattern of wiring, thus indicating a higher dependency of the magnitude of recess on the features of wiring pattern.

Figure 9:
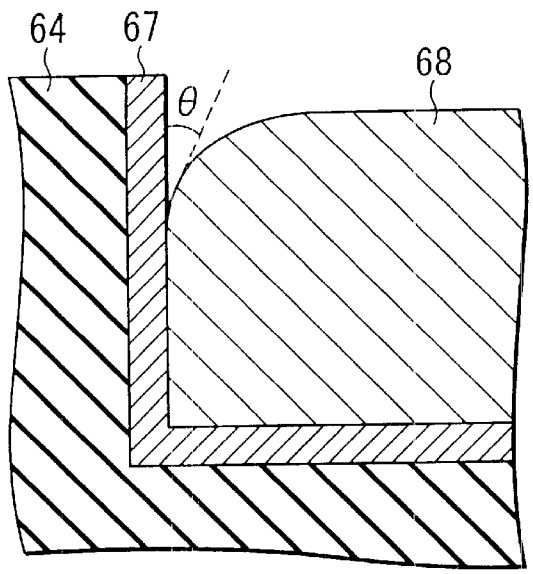
FIG. 9 is a cross-sectional view schematically showing the angle θ between the surf ace of Cu-damascene wiring and a TaN film constituting the sidewall of groove.

For the purpose of investigating the relationship between the cross-sectional configuration and the oxidation resistivity of Cu-wiring to be effected by a barrier film to be subsequently formed, the recess etching was performed by variously changing the etching solution. Based on the sectional SEM photograph, the angle θ between the surface of the Cu-wiring that had been recess-etched and the sidewall of groove was determined as a contact angle as shown in FIG. 9, thus taking this contact angle as an evaluation criterion for the cross-sectional configuration. Then, a TaN film having a thickness of 50 nm was deposited all over the surface of a wafer which was fabricated under the same conditions as described above by means of sputtering method, and subsequently, the wafer was subjected to the CMP treatment so as to remove the TaN film except the portions of the TaN film which were disposed on the Cu-wiring.

Then, the resistance of the Cu-wiring of the resultant wafer thus obtained was measured by making use of a prober, after which the wafer was further subjected to an accelerated test wherein the wafer was left to stand for one hour in an oven filled therein with air atmosphere heated to 300° C. When the electric resistance of the Cu-wiring was measured again by making use of the prober after this accelerated test, no change in electric resistance could be recognized in the values measured before and after this accelerated test in the sample where the TaN film constituting the barrier layer had a sufficient oxidation resistance. Whereas with respect to the sample where the Cu-wiring was oxidized due to its insufficient oxidation resistance, a prominent increase in electric resistance was observed in the sample.

Figure 10:
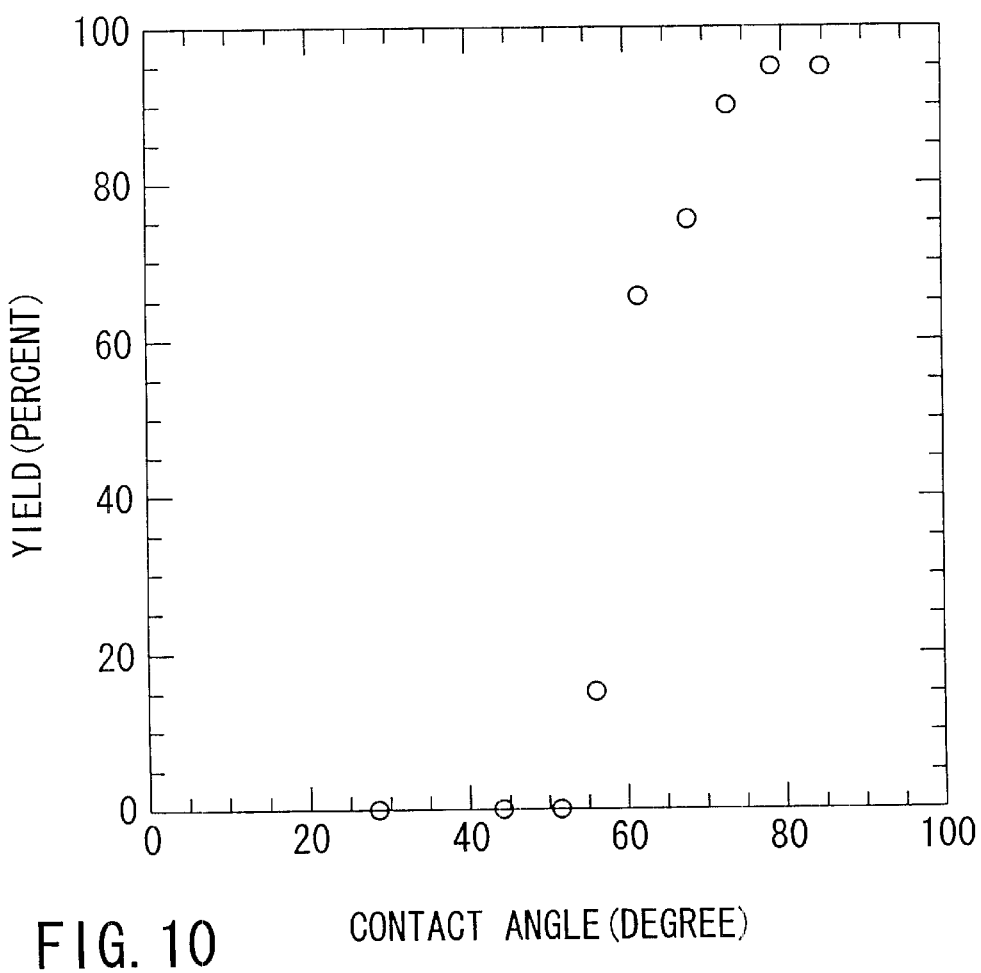
FIG. 10 is a graph illustrating the relationship between the yield and the contacting angle between the surface of Cu-damascene wiring and a TaN film constituting the sidewall of groove.

Then, the yield (acceptance probability) in terms of oxidation resistance was determined within the wafer on the basis that the chip whose Cu-wiring having a length of 3 m and Line/Space=0.2 μm/0.2 μm did not exhibit any increase in electric resistance after this accelerated test relative to the value measured before this accelerated test was assumed to be acceptable. Furthermore, the contact angle was determined on the basis of the configuration of the Cu-wiring obtained as a result of the recess etching treatment, and the relationship between the contact angle and the yield was investigated, the result being shown in FIG. 10.

In the case where the contact angle is small, i.e. where the etching of the sidewall portion of the Cu-wiring layer was faster than that of the central portion of the Cu-wiring, thus indicating a sharply engraved cross-section, the coverage by the TaN film to be subsequently formed would become poor at this sidewall portion of the Cu-wiring, so that the coverage by TaN film would be partitioned, thereby permitting the Cu-wiring to be entirely oxidized, and therefore, the yield would be 0%. Whereas, when this contact angle exceeded over 60° or so, the oxidation resistance was enabled to be improved, and when this contact angle became 70° or more, it became possible to ensure a sufficient oxidation resistance throughout the entire surface of the wafer.

As an additional test on the sample where the contact angle thereof was 85°, an insulation film was coated on a wafer bearing thereon a large number of Cu-wiring patterns and annealed for 60 hours at a temperature of 450° C. Subsequently, when the concentration of Cu in the coated insulation film was measured by dissolving the coated insulation film for this measurement, no significant difference could be found in the values measured of the concentration of Cu before and after this annealing.

It was confirmed from these results that the TaN film as a barrier layer was effective as a Cu diffusion preventive layer.

As explained above, since the recess etching is allowed to proceed uniformly from the surface of the wiring due to the fabrication of a multi-layer wiring by way of the aforementioned manufacturing process, it becomes possible to secure a sufficient coverage by the second barrier layer at the sidewall of the wiring, thereby making it possible to inhibit the oxidation of the wiring and to inhibit the diffusion of main element constituting the wiring during the subsequent processes, thus preventing the deterioration of yield. Furthermore, since the dependency of the magnitude of recess on the region within a wafer as well as the dependency of the magnitude of recess on the configuration of wiring pattern can be eliminated as mentioned above, it is now possible to prevent the resistance of wiring from being varied depending on the region within a wafer as well as on the configuration of wiring pattern, thus making it possible to obtain a desired performance of the semiconductor device.

There is also known an etching solution system which is capable of forming a complex even if an oxidizing agent is not included in the etching solution. However, such an etching solution system would invite a problem that the etching may be proceeded faster at the sidewall of wiring as in the case where the etching is performed using an acid. It is important, for the purpose of obtaining a uniform etching characteristic as obtained in this invention, to permit the afore-mentioned three steps (1) to (3) to be proceeded concurrently. By the way, it is preferable to provide means which enables a wafer to be rotatably introduced into a chamber in which an etching solution is forcibly circulated.

EXAMPLE 6

The treatments to be performed in this example is the same as those explained in Example 5 except the recess etching treatment to be performed after the CMP treatment, so that only this recess etching treatment will be explained below.

After finishing the CMP treatment of the Cu-damascene wiring and the TaN film by means of the polishing pad of CMP apparatus, the recess etching treatment and washing treatment of a wafer were concurrently performed, while allowing the wafer to rotate at a speed of 150 rpm, in a washing chamber which was installed in a CMP apparatus to which the same kind of etching solution as employed in Example 5 can be supplied, thereby forming a recessed portion.

Then, after finishing rinsing of the wafer for 5 minutes, the wafer was dried. The magnitude of the recess etching was 50 nm, and the in-plane uniformity and cross-sectional configuration of the wafer were found excellent, i.e., no substantial difference in magnitude of etching depending on the configuration of pattern was recognized. Further, after the deposition of a TaN film as a second barrier layer, the wafer was subjected to the CMP treatment, thereby obtaining a recessed portion which was buried with the TaN film.

When the evaluation of wafer was performed after the accelerated test of wafer was conducted in the same manner as in Example 5, the TaN film as a second barrier layer was found effective as an excellent oxidation preventive layer as well as a Cu diffusion preventive layer.

As explained above, it is possible to shorten the processing time of wafer by enabling the flattening treatment and the recess etching treatment to be continuously performed inside the CMP apparatus (flattening apparatus).

The third embodiment of this invention should not be construed to be limited to the aforementioned example. For example, in the aforementioned example, a diluted hydrogen peroxide solution containing glycine (amino acid) was employed as a complex forming agent. However, it was possible to obtain almost the same excellent configuration of recess as explained above even if other kinds of amino acid, ethylene-diamine or ethylene-diamine tetraacetate was included as a complex forming agent in the diluted hydrogen peroxide (an oxidizing agent). Further, it was also possible to obtain almost the same configuration of recess as explained above even if ammonium peroxosulfate or an aqueous solution of ozone was employed as an oxidizing agent.

As for the main element constituting the wiring layer in this third embodiment of the invention, it is possible to employ Ag, Au or Pt other than Cu. When these elements other than Cu are employed, care should be taken that the oxidizing agent, the complex forming agent and the solvent are suitably selected. Further, even if an alloy containing, as a main constituent element, any of the aforementioned element is employed, the etching property thereof would not be badly affected. For example, it is possible, as a Cu alloy, to employ a Cu—Si alloy, a Cu—Al alloy, a Cu—Si—Al alloy, a Cu—Ag alloy, etc.

Further, although TaN film was employed for both of the first and second barrier layers, the first barrier layer may be constituted by a different material from that employed for the second barrier layer.

It is possible, for the purpose of improving the adhesivity between the wiring and second barrier layer, to pre-treat the surface of the wiring or to form a layer containing other kinds of element.

Figure 11A:
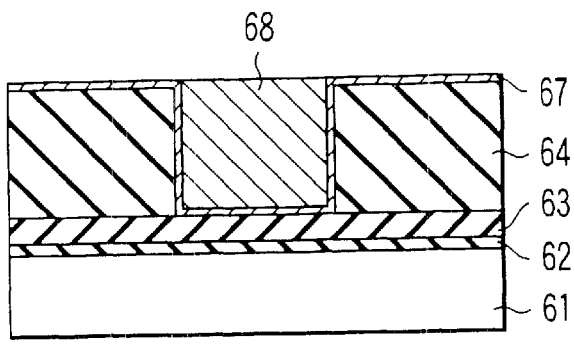
FIGS. 11A to 11D are cross-sectional views illustrating the process of manufacturing a semiconductor device, which is a modified example of the process shown in FIGS. 5A to 5H.
Figure 11B:
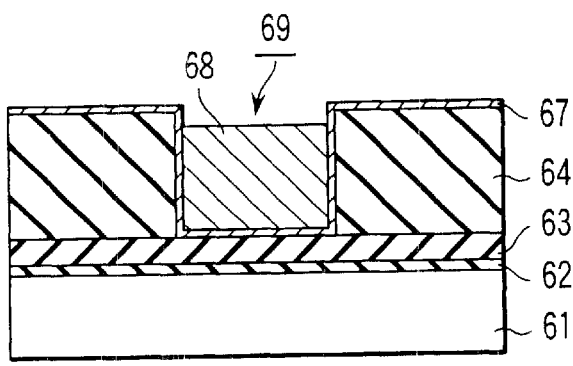
Figure 11C:
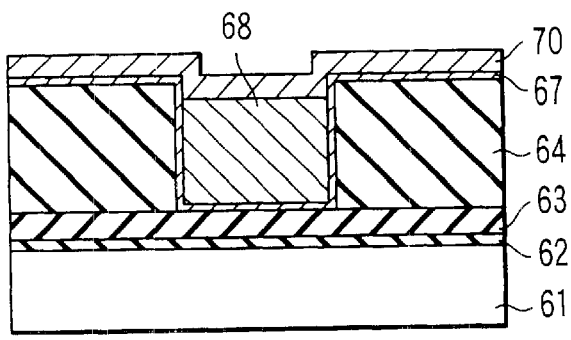
Figure 11D:
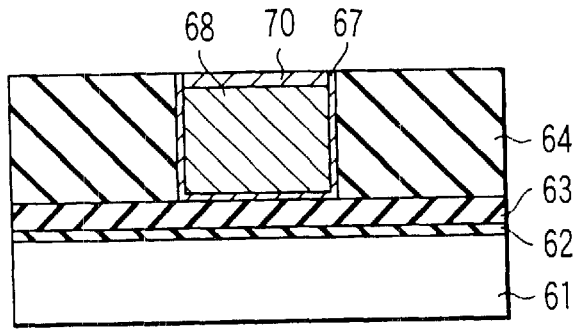

Although the first barrier layer disposed on the insulating layer was selectively removed prior to the recess etching treatment in the aforementioned example, this first barrier layer may be removed after the recess etching treatment. For example, after finishing the flattening treatment of the Cu-wiring layer 68 which is disposed on the TiN film 67 (FIG. 11A), the aforementioned recess etching treatment is performed so as to depress the surface of the Cu-damascene wiring 68 to thereby form the recessed portion 69 (FIG. 11B). Then, a TaN film 70 is deposited (FIG. 11C), and then, the TaN film 70 and the TiN film 67 are subjected to a flattening treatment until the surface of the insulating layer 64 is exposed (FIG. 11D).

As explained above, according to this third embodiment of the invention, since the recess etching treatment of the surface of wiring layer is performed using an etching solution comprising an oxidizing agent for the main element constituting the wiring, a complex forming agent which is capable of forming a complex together with ions of the main element constituting the wiring, and a solvent for the complex, the etching will be proceeded according to three processes consisting of: (1) the ionization of the main constituent element through the reaction between the oxidizing agent and this main constituent element of the wiring; (2) the formation of a complex of the main constituent element through the reaction between this ionized main constituent element and the complex forming agent; and (3) the dissolution and removal of the complex thus formed by making use of a solvent. As a result, the recess etching is allowed to proceed uniformly from the surface of the wiring, and at the same time, it becomes possible to eliminate the dependency of the magnitude of recess on the region within a wafer as well as the dependency of the magnitude of recess on the configuration of wiring pattern.

Since the recess etching is allowed to proceed uniformly from the surface of the wiring, it becomes possible to secure a sufficient coverage by the second barrier layer at the sidewall of the wiring, thereby making it possible to inhibit the oxidation or diffusion of the elements constituting the wiring during the subsequent processes and hence to prevent the deterioration of yield. Furthermore, since the dependency of the magnitude of recess on the region within a wafer as well as the dependency of the magnitude of recess on the configuration of wiring pattern can be eliminated as mentioned above, it is now possible to prevent the resistance of wiring from being varied depending on the region within a wafer as well as on the configuration of wiring pattern, thus making it possible to obtain a desired performance of the semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, which comprises:
   forming an intermediate layer on an insulating layer formed in advance on a semiconductor substrate;
   forming a groove in the intermediate layer and the insulating layer;
   forming a first barrier layer on an inner surface of the groove;
   depositing a wiring layer to thereby fill the groove with the wiring layer via the first barrier layer;
   performing a flattening treatment of a surface of the wiring layer to thereby form a buried structure comprising the first barrier layer and a wiring inside the groove;
   removing a surface portion of the wiring to thereby permit the surface of the wiring to be recessed to a level which is lower than a surface of the insulating layer, thus forming a recessed portion;
   forming a second barrier layer above a surface of the intermediate layer as well as on an inner surface of the recessed portion;
   performing a flattening treatment of a surface of the second barrier layer, thereby allowing the surface of the intermediate layer to be exposed; and
   removing the intermediate layer, thereby allowing the surface of the insulating layer to be exposed.

2. The method according to claim 1, wherein said step of selectively removing the intermediate layer is followed by a step of performing a chemical mechanical polishing under a condition wherein the second barrier layer is polished.

3. The method according to claim 1, wherein said intermediate layer is formed of at least one kind of film selected from the group consisting of a carbon film, a silicon nitride film and a silicon oxide film.

4. A method of manufacturing a semiconductor device, which comprises the steps of:
   forming a groove in an insulating layer formed in advance on a semiconductor substrate;
   forming a first barrier layer on a surface of the insulating layer as well as on an inner surface of the groove;
   depositing a wiring layer on a surface of the first barrier layer to thereby fill the groove with the wiring layer;
   performing a flattening treatment of a surface of the wiring layer to thereby allow the first barrier layer to be continuously left at least on the insulating layer throughout an entire surface of the semiconductor substrate, thereby filling the groove with a wiring;

removing a surface portion of the wiring to thereby permit the surface of the wiring to be recessed to a level which is lower than a surface of the insulating layer, thus forming a recessed portion;

forming a second barrier layer on the first barrier layer as well as on the wiring by means of an electro-plating method where the first barrier layer remaining on the insulating layer is employed as an electrode; and performing a flattening treatment of surfaces of the second barrier layer and the first barrier layer until the surface of the insulating layer is exposed.

5. The method according to claim 4, wherein said wiring layer is formed by means of an electro-plating method.

6. A method of manufacturing a semiconductor device, which comprises the steps of:

forming a conductive layer on an insulating layer formed in advance on a semiconductor substrate;

forming a groove penetrating into the conductive layer and the insulating layer;

forming a first barrier layer on a surface of the conductive layer as well as on an inner surface of the groove;

depositing a wiring layer on a surface of the first barrier layer to thereby fill the groove with the wiring layer;

performing a flattening treatment of a surface of the wiring layer to thereby allow the conductive layer to be continuously left at least on the insulating layer, thereby filling the groove with a wiring;

removing a surface portion of the wiring to thereby permit the surface of the wiring to be recessed to a level which is lower than a surface of the insulating layer, thus forming a recessed portion;

forming a second barrier layer on the conductive layer as well as on the wiring by means of an electro-plating method where the conductive layer remaining on the insulating layer is employed as an electrode; and performing a flattening treatment of surfaces of the second barrier layer and the conductive layer until the surface of the insulating layer is exposed.

7. The method according to claim 6, wherein said wiring layer is formed by means of an electro-plating method.

8. A method of manufacturing a semiconductor device, which comprises:

forming a groove in an insulating layer formed in advance on a semiconductor substrate;

forming a first barrier layer on an inner surface of the groove;

depositing a wiring layer to thereby fill the groove with the wiring layer via the first barrier layer;

performing a flattening treatment of a surface of the wiring layer to thereby form a structure comprising the first barrier layer and a wiring which are buried inside the groove;

performing a recess etching treatment of the wiring by making use of an etching solution comprising an oxidizing agent which is reactive to a main element constituting the wiring, a complex forming agent which is capable of forming a complex together with ions of the main element constituting the wiring, and a solvent for the complex, thereby permitting the surface of the wiring to be recessed to form a recessed portion, said surface of the wiring being of convex shape;

forming a second barrier layer on the wiring as well as above the insulating layer to thereby fill the recessed portion with the second barrier layer; and performing a flattening treatment of a surface of the second barrier layer until the surface of the insulating layer is exposed, thereby leaving the second barrier layer inside the recessed portion.

9. The method according to claim 8, wherein said oxidizing agent is at least one kind of material selected from the group consisting of an aqueous solution of hydrogen peroxide, ammonium peroxosulfate and an aqueous solution of ozone.

10. The method according to claim 8, wherein said complex forming agent is at least one kind of material selected from the group consisting of amino acid, ethylenediamine, ethylene-diamine-tetraacetic acid and aminosulfonic acid.

11. The method according to claim 10, wherein said amino acid is glycine.

12. The method according to claim 8, wherein said solvent is water.

13. The method according to claim 8, wherein said recess etching treatment is continuously performed inside a flattening device employed in the preceding step of flattening treatment.

14. The method according to claim 8, wherein said recess etching treatment is performed inside a processing chamber employed in a washing step to be performed subsequent to the preceding step of flattening treatment.

15. The method according to claim 8, wherein said angle between the surface of the wiring and the first barrier layer at a sidewall of the groove is 60° or more.

16. A method of manufacturing a semiconductor device, which comprises:

forming a groove in an insulating layer formed in advance on a semiconductor substrate;

forming a first barrier layer on an inner surface of the groove;

depositing a wiring layer to thereby fill the groove with the wiring layer via the first barrier layer;

performing a flattening treatment of a surface of the wiring layer to thereby form a structure comprising the first barrier layer and a wiring which are buried inside the groove;

performing a recess etching treatment of the wiring, thereby permitting the surface of the wiring to be recessed to form a recessed portion, an angle between the recessed surface of the wiring and the first barrier layer at a sidewall of the groove being 60° or more, and said surface of the wiring being of convex shape;

forming a second barrier layer on the wiring as well as above the insulating layer to thereby fill the recessed portion with the second barrier layer; and performing a flattening treatment of a surface of the second barrier layer until the surface of the insulating layer is exposed, thereby leaving the second barrier layer inside the recessed portion.

* * * * *